United States Patent
Lewis et al.

(10) Patent No.: US 7,456,653 B2
(45) Date of Patent: Nov. 25, 2008

(54) PROGRAMMABLE LOGIC DEVICE HAVING LOGIC ARRAY BLOCK INTERCONNECT LINES THAT CAN INTERCONNECT LOGIC ELEMENTS IN DIFFERENT LOGIC BLOCKS

(75) Inventors: David Lewis, Toronto (CA); David Cashman, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/684,424

(22) Filed: Mar. 9, 2007

(65) Prior Publication Data

US 2008/0218208 A1 Sep. 11, 2008

(51) Int. Cl.
*H03K 19/177* (2006.01)
(52) U.S. Cl. .......................... 326/41; 326/39
(58) Field of Classification Search ............. 326/38–41, 326/47
See application file for complete search history.

(56) References Cited

U.S. PATENT DOCUMENTS

| | | | |
|---|---|---|---|
| 4,706,216 A | 11/1987 | Carter | |
| 4,758,985 A | 7/1988 | Carter | |
| 5,260,610 A | 11/1993 | Pedersen et al. | |
| 5,331,226 A | 7/1994 | Goetting | |
| 5,352,940 A | 10/1994 | Watson | |
| 5,399,922 A | 3/1995 | Kiani et al. | |
| 5,438,295 A | 8/1995 | Reddy et al. | |
| 5,488,316 A | 1/1996 | Freeman et al. | |
| 5,689,195 A | 11/1997 | Cliff et al. | |
| 5,815,003 A | 9/1998 | Pedersen | |
| 5,821,773 A | 10/1998 | Norman et al. | |
| 5,831,448 A | 11/1998 | Kean | |
| 5,835,998 A | 11/1998 | Pedersen | |
| 5,850,152 A | 12/1998 | Cliff et al. | 326/40 |
| 5,920,202 A | 7/1999 | Young et al. | |
| 5,923,185 A | 7/1999 | Zhou | |
| 5,953,537 A | 9/1999 | Balicki et al. | |

(Continued)

FOREIGN PATENT DOCUMENTS

WO    WO98/38741    3/1998

OTHER PUBLICATIONS

EPO Search Report mailed Jul. 9, 2008 in related European Application No. 08003479.6, 4 pages.

(Continued)

*Primary Examiner*—Vibol Tan
(74) *Attorney, Agent, or Firm*—Weaver Austin Villeneuve Sampson LLP

(57) ABSTRACT

A PLD with LAB interconnect lines that span adjacent LABs in the array and that have the ability to interconnect two logic elements in the different LABs. The PLD includes a plurality of LABs arranged in an array and a plurality of inter-LAB lines interconnecting the LABs of the array. Each of the LABs include a predetermined number of logic elements, one or more control signals distributed among the predetermined number of logic elements in the LAB, and LAB lines spanning between logic elements in different LABs in the array. In various embodiments, the LAB lines are arranged in a staggered pattern with a predetermined pitch between the lines. In other embodiments, the control signals of adjacent LABs can overlap, allowing control signals to be routed to the logic elements of adjacent LABs.

30 Claims, 5 Drawing Sheets

U.S. PATENT DOCUMENTS

| | | | |
|---|---|---|---|
| 5,999,015 A | 12/1999 | Cliff et al. | |
| 5,999,016 A | 12/1999 | McClintock et al. | |
| 6,020,756 A | 2/2000 | New | |
| 6,034,540 A | 3/2000 | Mendel | |
| 6,051,992 A | 4/2000 | Young et al. | |
| 6,066,960 A | 5/2000 | Pedersen | |
| 6,069,487 A | 5/2000 | Lane et al. | |
| 6,069,490 A * | 5/2000 | Ochotta et al. | 326/41 |
| 6,084,427 A | 7/2000 | Lee et al. | |
| 6,094,065 A | 7/2000 | Tavana et al. | |
| 6,107,822 A | 8/2000 | Mendel et al. | |
| 6,118,300 A | 9/2000 | Wittig et al. | |
| 6,122,720 A | 9/2000 | Cliff | |
| 6,124,731 A | 9/2000 | Young et al. | |
| 6,133,751 A * | 10/2000 | Churcher et al. | 326/49 |
| 6,166,559 A | 12/2000 | McClintock et al. | 326/10 |
| 6,167,558 A | 12/2000 | Trimberger | |
| 6,184,707 B1 | 2/2001 | Norman et al. | |
| 6,191,610 B1 | 2/2001 | Wittig et al. | |
| 6,201,404 B1 | 3/2001 | Reddy et al. | |
| 6,201,410 B1 | 3/2001 | New et al. | |
| 6,211,696 B1 | 4/2001 | Skahill et al. | |
| 6,249,149 B1 | 6/2001 | Pedersen | |
| 6,255,846 B1 | 7/2001 | Lee et al. | |
| 6,271,680 B1 | 8/2001 | Mendel et al. | |
| 6,275,065 B1 | 8/2001 | Mendel | |
| 6,323,677 B1 | 11/2001 | Lane et al. | |
| 6,323,682 B1 | 11/2001 | Bauer et al. | |
| 6,344,755 B1 | 2/2002 | Reddy et al. | |
| 6,362,648 B1 | 3/2002 | New et al. | |
| 6,400,180 B2 | 6/2002 | Wittig et al. | |
| 6,538,470 B1 * | 3/2003 | Langhammer et al. | 326/41 |
| 6,545,501 B1 | 4/2003 | Bailis et al. | 326/10 |
| 6,965,249 B2 | 11/2005 | Lane et al. | |
| 6,970,014 B1 | 11/2005 | Lewis et al. | |
| 7,061,268 B1 | 6/2006 | Lee et al. | 326/39 |
| 7,180,324 B2 | 2/2007 | Chan et al. | |
| 7,215,140 B1 | 5/2007 | Saini et al. | 326/41 |
| 7,218,133 B2 | 5/2007 | Lewis | 326/10 |
| 2002/0157071 A1 | 10/2002 | Schiefele et al. | 716/6 |
| 2003/0072185 A1 | 4/2003 | Lane et al. | 365/189.02 |
| 2003/0201793 A1 | 10/2003 | Nguyen et al. | 326/41 |

OTHER PUBLICATIONS

USPTO Office Action mailed May 15, 2008 in related U.S. Appl. No. 11/739,055, 9 pages.

"The Stratix Architecture, Functional Description," pp. 2-1 through 2-140, from the Altera Corporation, Jul. 2005 (Altera Internal document No. S51002-3.2).

"The Stratix® PII Architecture, Functional Description," pp. 2-104, The Stratix® II Device handbook, vol. 1, Dec. 2005 (Altera Document No. SII51002-4.0).

* cited by examiner

PROGRAMMABLE LOGIC DEVICE HAVING LOGIC ARRAY BLOCK INTERCONNECT LINES THAT CAN INTERCONNECT LOGIC ELEMENTS IN DIFFERENT LOGIC BLOCKS

BACKGROUND

1. Field of the Invention

The present invention generally relates to Logic Array Block (LAB) based Programmable Logic Devices (PLDs), and more particularly, LAB interconnect lines that have the ability to be interconnect Logic Elements (LEs) in two different LABs.

2. Description of Related Art

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with ASICs and reduced product development times makes the use of PLDs compelling for many OEMs.

The architecture of most PLDs defines a two-dimensional array of logic blocks. Row and column inter-logic block lines, typically of varying length and speed, provide signal and clock interconnects between the blocks of logic in the array. The blocks of logic are often referred to by various names, for example as Logic Array Blocks or LABs by the Altera Corporation, assignee of the present application, or Complex Logic Blocks (CLBs), as used by Xilinx Corporation. In the Altera architectures, the LABs are further broken into a plurality of individual logic elements referred to as Logic Elements (LEs) or Adaptive Logic Modules (ALMs). With the Xilinx architecture, the CLBs also include a group of logic elements called Logic Cells or (LCs). The LEs, LCs, or ALMS each typically include such elements as look up tables (LUTs), registers for generating registered outputs, adders and other circuitry to implement various logic and arithmetic functions. For the sake of simplicity, any block of logic containing multiple LEs or ALMs, regardless if organized into a LAB or CLBs, is hereafter generically referred to as a "LABs". In no way should the term "LAB" be construed as limiting the present invention to a particular PLD architecture and is intended to cover any PLD architecture that uses any type of logic elements grouped together in a block.

The interconnect of most PLDs includes at least two levels: (i) inter-LAB lines that provide the routing between LABs; and (ii) an intra-LAB lines that provide routing within the LABs. For detailed explanation of a two level interconnect hierarchy for a PLD, see U.S. Pat. No. 6,970,014, incorporated herein for all purposes. A brief summary of a two level architecture, however, is provided below.

The inter-LAB interconnect typically includes a plurality of horizontal and vertical lines having a length spanning a predetermined number of LABs. In various PLDs, the inter-LAB lines are not necessarily the same length. For example, it has been known to use global, half, quarter length lines as well as staggered lines each that run a fixed number of LABs (e.g., 4 LABs). "Stitching" buffers and switching multiplexers are periodically provided along the inter-LAB lines. The stitching buffers are provided to stitch together the lines of a given channel and to buffer the signals propagating between the stitched lines. The switching multiplexers are typically provided at the intersection of horizontal and vertical lines and are provided to switch a signal from a horizontal line to a vertical line or vice-versa.

The lower level of interconnect, often referred to as "LAB lines", provide dedicated routing within a given LAB. In other words, LAB lines interconnect the LEs within a given LAB, but cannot directly communicate with other LEs in other LABs in the array. With this arrangement, the LEs within the same LAB can directly communicate with one another at a relatively high speed. Communication between LEs in different LABs, however, is slower because signals have to be first routed and propagate through the inter-LAB interconnect to the LAB lines of the second LAB.

The issue with the aforementioned interconnect hierarchy is there is no way for an LE in one LAB to directly communicate with an LE in another LAB. The strict hierarchy of limiting intra LAB lines to only within a given LAB means that there is a hard boundary between the individual LABs in known PLD architectures. Consequently, with complex logic designs where many LABs are used, performance is often compromises by the propagation time required to send signals between LABs.

A PLD with LAB interconnect lines that span adjacent LABs in the array and that have the ability to interconnect two LEs in the different LABs is therefore needed.

SUMMARY OF THE INVENTION

A PLD with LAB interconnect lines that span adjacent LABs in the array and that have the ability to interconnect two logic elements in the different LABs is disclosed. The PLD includes a plurality of LABs arranged in an array and a plurality of inter-LAB lines interconnecting the LABs of the array. Each of the LABs include a predetermined number of logic elements, one or more control signals distributed among the predetermined number of logic elements in the LAB, and LAB lines spanning between logic elements in different LABs in the array. In various embodiments, the LAB lines are arranged in a staggered pattern with a predetermined pitch between the lines. In other embodiments, the control signals of adjacent LABs can overlap, allowing control signals to be routed to the logic elements of adjacent LABs.

BRIEF DESCRIPTION OF THE DRAWINGS

The invention may best be understood by reference to the following description taken in conjunction with the accompanying drawings, which illustrate specific embodiments of the present invention.

It should be noted that like reference numbers refer to like elements in the figures.

DETAILED DESCRIPTION OF SPECIFIC EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1:
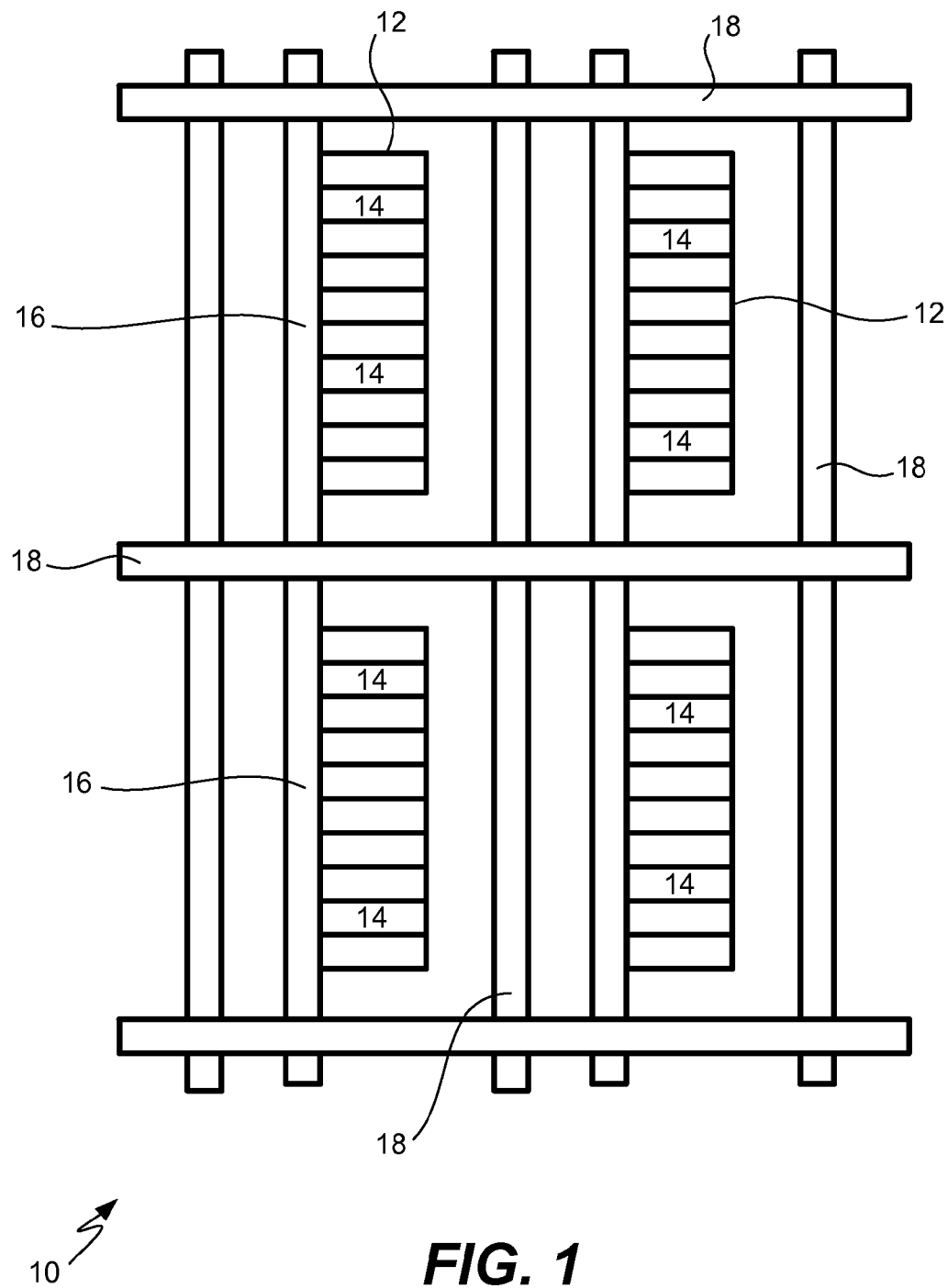
FIG. 1 is a block diagram of a Programmable Logic Device (PLD) architecture having LAB lines that run between adjacent LABs in accordance with the present invention.

Referring to FIG. 1, a block diagram of a Programmable Logic Device (PLD) having LAB lines that run between adjacent LABs in accordance with the present invention is shown. The PLD 10 includes a plurality of LABs 12 arranged in a two dimensional array. Each of the LABs 12 includes a plurality of logic elements 14 and LAB lines 16. The PLD 10 also includes a plurality of horizontal and vertical inter-LAB lines 18, which are used to route signals between the LABs 12. (For the sake of simplicity, the individual LAB lines 16 and the inter-LAB lines 18 are not illustrated in the figure.)

In accordance with different embodiments of the invention, the number of logic elements 14 per LAB 12 may vary, from two to sixteen for example. Similarly, the length of the horizontal and vertical intra-LAB lines 18 may also vary. For example, the lines 18 may span the entire height or width of the array, half or a quarter of the array, or some other arbitrary length. In some embodiments, the lines 18 may span a predetermined number of LABs 12, such as two, four, eight, sixteen or more. The individual lines 18 may also be arranged in a staggered pattern with respect to one another. In other embodiments, inter-Lab lines 18 of a given channel may be stitched together by stitching buffers and switching multiplexers may be used to route signals from horizontal lines to vertical lines and vice versa. In yet another embodiment, the lines 18 may be L-shaped and run in both the horizontal and vertical directions. For more details on the inter-LAB lines 18, see U.S. Pat. No. 6,970,014, incorporated herein for all purposes.

With the present invention, the individual LAB lines 16 are not exclusively aligned or included within the boundaries of the corresponding LAB 12. As described and illustrated in more detail below, the individual LAB lines 16 have different start and end points with respect to their corresponding LAB 12. Accordingly, some of the LAB lines 16 may span more than one LAB 12. Individual LAB lines 16 may therefore connect logic elements 14 in different LABs 12. For this reason, the lab lines 16 in FIG. 1 are illustrated as being "continuous", i.e., not terminating at the boundary of each LAB 12.

Prior to explaining the details of the LAB lines 16 in accordance with the present invention, a brief review of a typical prior art LAB is provided. By contrasting a prior art LAB, the features and advantages of the present invention can be better appreciated.

Figure 2A:
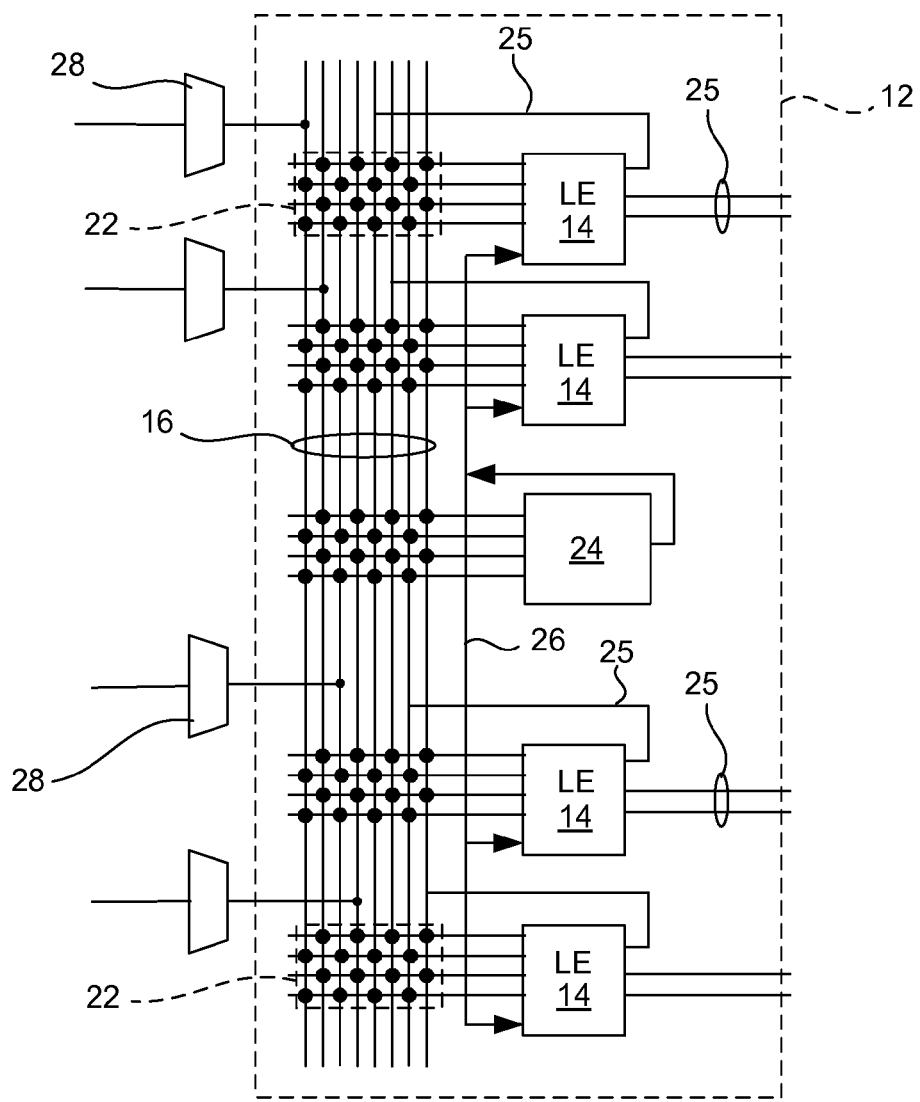
FIG. 2A is a logic diagram of a standard LAB.

Referring to FIG. 2A, a logic diagram of a standard LAB is shown. With a standard LAB 12, the boundary (as designated by the dashed line around the LAB) is well defined. The LAB 12 includes a plurality of logic elements 14 interconnected by a plurality of LAB lines 16. As illustrated, the individual LAB lines 16 all have the same start and termination point at the top most and bottom most logic elements 14 respectively. A programmable interconnect pattern 22 is provided at the intersection between the inputs to the logic elements 14 the LAB lines 16. Each logic element generates one or more outputs 25. The LAB 14 also includes one or more control signal generators 24, which generate control signals 26 that are distributed to each of the logic elements 14 within the LAB 12. In various embodiments, the control signals include, but are not limited to, the following: clock signals, clock enable signals, clear signals and load signals. Since the individual LAB lines 16 span only the logic elements 16 within the LAB 12, signals can be routed only within the LAB 12. If a signal is to be routed to a logic element 14 in another LAB 12, the inter-LAB interconnects 18 must be used. For more information on the control signals, see The Stratix II Architecture, Functional Description, pages 2-1 through 2-106, Altera Corporation document number SII1002-4.2, August, 2006 for example, incorporated by reference herein for all purposes.

The programmable interconnect pattern 22 is made up of a plurality of programmable connections (as represented by black dots in the figures). A single programmable connection is provided at the intersection of the inputs to the logic elements 14 and the LAB lines 16. According to various embodiments, the programmable connections may include multiplexers, pass transistors, configuration RAM storage cells, ROM storage cells, fuses, or any other known programmable elements used in the art.

Figure 2B:
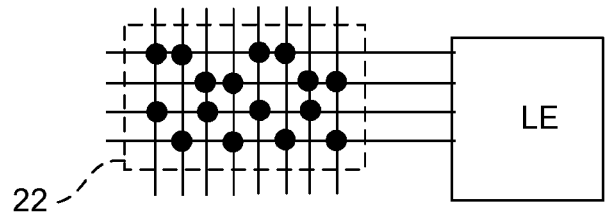
FIG. 2B is an alternative programmable interconnect pattern between the LAB lines and the input of an LE.

Referring to FIG. 2B, an alternative programmable interconnect pattern 22 between the LAB lines 16 and the input of an LE 14 is shown. In FIG. 2A, the interconnect pattern shows a pattern where alternating LAB lines 16, starting from left to right, are connected to the second and forth or the first and third inputs to each logic element 14 respectively. In FIG. 2B, the pattern shows, starting from the left to right, the LAB lines 16 connected to the first and third, first and fourth, second and third, and second and fourth inputs of the logic element 14. With the next four lines 16, again moving from left to right, the above-defined pattern is repeated. It should be noted that the patterns 22 shown in FIGS. 2A and 2B are examples and should not be construed as limiting the present invention. Any suitable pattern 22 may be used.

In FIG. 2, the routing drivers 28 for driving the LAB 12 is a simplified logic diagram. In actual embodiments, the driver functions represented by element 28 includes a number of LAB Input Multiplexers (LIMs) or Driver Input Multiplexers (DIMs), which may connect to either Horizontal or Vertical wires (HDIMs) and (VDIMs).

Figure 3:
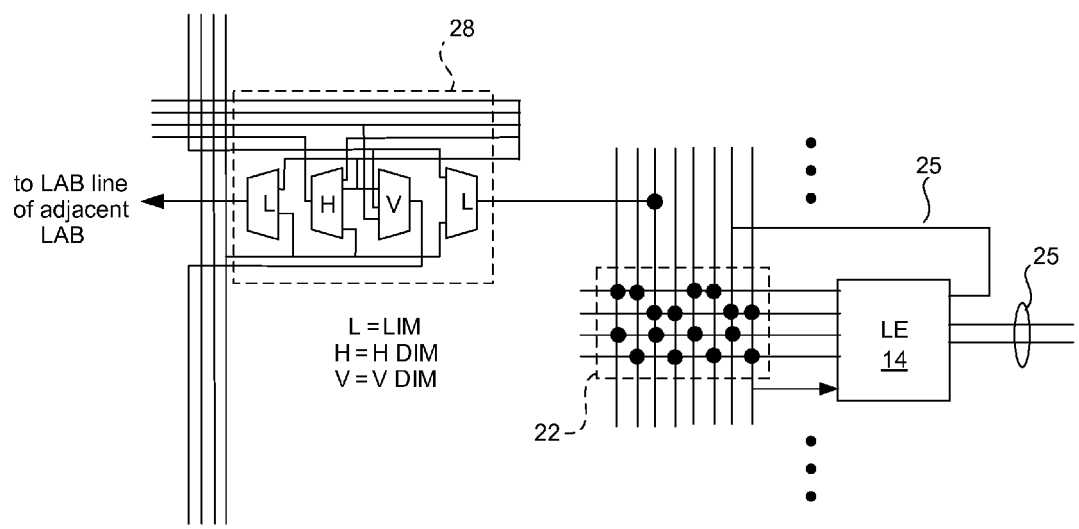
FIG. 3 illustrates a multiplexer arrangement for providing inputs to a LAB.

Referring to FIG. 3, a detailed logic diagram for the routing drivers 28 is shown according to one embodiment of the invention. The routing drivers 28 include a number of LIMs and DIMs, each designated with either an "L" (i.e., LIM), "V" (i.e., HDIM) or "V" (i.e., VDIM). Each of these multiplexers has inputs that may include one or more routing inter-LAB lines 18 (both horizontal and vertical), or outputs from one or more logic elements 14. The HDIM drives horizontal inter-LAB lines 18 and is capable of receiving inputs from logic elements 14 from the adjacent LABs 12 (i.e., the LABs 12 on the left and the right of the HDIM multiplexer) as well as both HDIMs and VDIMs. The VDIMs drive vertical inter-LAB lines 18 and is capable of receiving inputs from logic elements 14 in the adjacent LABs 12 (again, from the LABs 12 on the left and the right of the V DIM multiplexer) as well as the HDIMs and VDIMs. The two LIMs generate output signals to drive the adjacent left and right LABs 12 and may include inputs from the adjacent LABs 12 respectively and the HDIMs and VDIMs.

Figure 4:
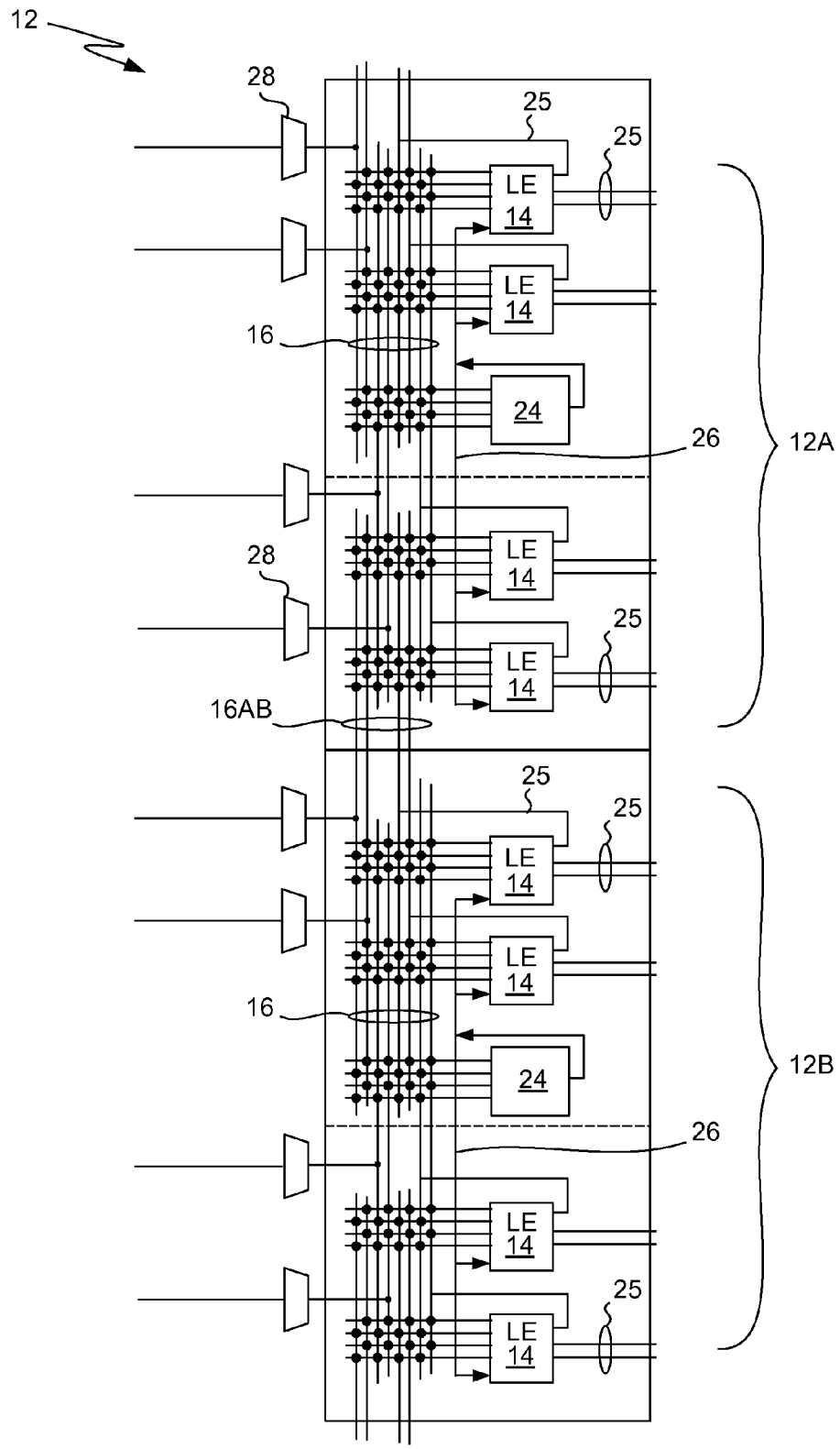
FIG. 4 is a logic diagram of a LAB according to one embodiment of the present invention.

FIG. 4 is a logic diagram of two LABs according to one embodiment of the present invention. The two LABs, designated as 12A and 12B, are adjacent to one another in the vertical direction. Both LABs 12A and 12B, in this example, each include four logic elements 14. Each logic element 14 generates one or more outputs 25 and receives inputs from the local LAB lines 16 via a programmable interconnect pattern 22 of programmable elements. Each LAB 12A and 12B also includes a control signal generator 24, which generate control signals 26 that are distributed to the four logic elements 14 within each LAB. The LAB lines 16 of the Labs 12A and 12B differ from what is used in previous designs. The LAB lines 16 are not aligned with the top-most and bottom-most logic element 14, nor do they provide connectivity exclusively within the LABs 12A and 12B respectively. On the contrary, the individual LAB lines 16 are staggered with respect to one another. Furthermore, some of the LAB lines 16 span more than one LAB. For example, the LAB lines designated "16AB" span between LABs 12A and 12B respectively. According to various embodiments, the LAB lines 16 of the present invention are staggered with respect to one another to varying degrees, corresponding to the pitch of the wires. In different embodiments for example, the individual lines 16 can be have a pitch of one, two, three, four, five, six seven, eight, or more logic elements respectively. In the example of FIG. 4 the pitch is two, since LAB lines start at either the first or third logic element in the LAB. The LAB lines 16 can also be staggered using a pitch based on a certain percentage of a given LAB 12. For example, the LAB lines can be a half, quarter, eight, or sixteenth, or some other percentage, of the size of a LAB 12. In FIG. 4, the pitch of two corresponds to half of the LAB containing four logic elements.

With the LAB lines 16 spanning more than one LAB 12, the boundary between the LABs becomes blurred, at least in terms how LABs have been historically defined. In the past, the hard boundary of a LABs was typically defined by the uniform start and termination points of the LAB lines coinciding with the top and bottom most logic elements in the LAB. With the present invention, however, this hard boundary is no longer present because at least some of the LAB lines are staggered and may span between two LABs 12A and 12B. Accordingly, with the present invention, the boundary definition of a LAB is redefined. The control signals 26, generated by the control signal generators 24, spans the all the logic elements 14 within the LABs 12A and 12B respectively. The control signals 26 therefore in the context of the present invention are used to delineate the boundaries of the LABs 12A and 12B respectively.

Figure 5:
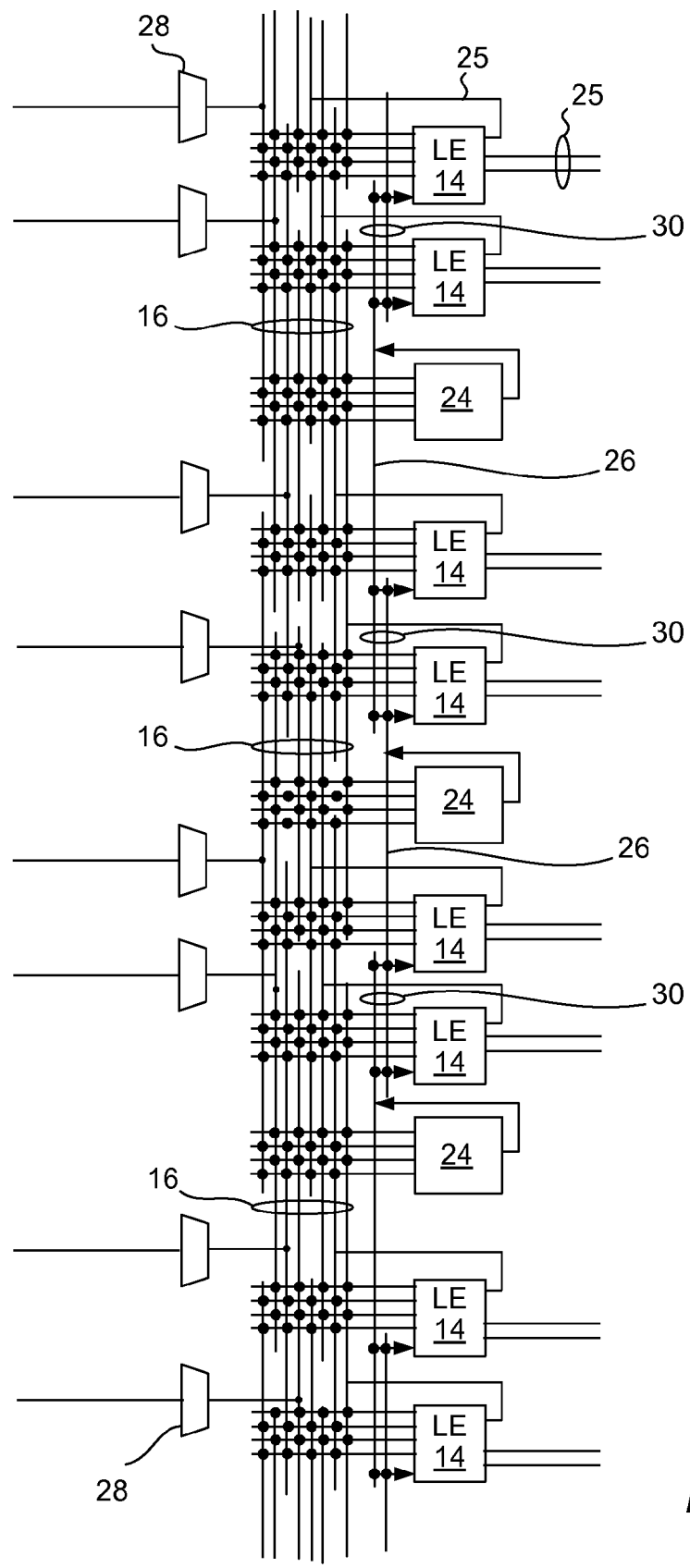
FIG. 5 is a logic diagram of a LAB according to another embodiment of the present invention.

Referring to FIG. 5, a logic diagram of a LAB according to another embodiment of the present invention is shown. With this embodiment, the staggering concept is extended to the control lines 26. As illustrated in the figure, each of the control signal generators 26 generates a control signal 26 that extends above and below two logic elements 16, or a total of four logic elements 16. Since the control signal generators 26 are spaced apart every three logic elements 14, the control signals 26 partially overlap with one another, as designated by reference numeral 30. The logic elements 14 adjacent the overlapping areas 30 can therefore receive control signals from two different control signal generators 26 of different LABs 12. It can also be noted that the pitch of the LAB lines has been changed to one compared to the pitch of two in FIG. 4.

While the invention has been particularly shown and described with reference to specific embodiments thereof, it will be understood by those skilled in the art that changes in the form and details of the disclosed embodiments may be made without departing from the spirit or scope of the invention. It is therefore intended that the invention be interpreted to include all variations and equivalents that fall within the true spirit and scope of the present invention.

What is claimed is:

1. An apparatus, comprising: a programmable logic device, the programmable logic device including:
    a plurality of LABs arranged in an array; a plurality of inter-LAB lines interconnecting the LABs of the array, wherein each of the LABs further include:
    a predetermined number of logic elements;
    one or more control signals distributed among the predetermined number of logic elements in the LAB; and
    LAB lines spanning between logic elements, wherein the logic elements are in different LABs in the array.

2. The apparatus of claim 1, wherein the LAB lines within each LAB are arranged in a staggered pattern.

3. The apparatus of claim 2, wherein the staggered LAB lines within each LAB have a predetermined pitch with respect to one another.

4. The apparatus of claim 3, wherein the predetermined pitch consists of one of the following: one, two, three, four, five, six, seven, eight, or more than eight logic elements respectively.

5. The apparatus of claim 3, wherein the predetermined pitch is an integral fraction of the number of logic elements in the LAB.

6. The apparatus of claim 5, wherein the predetermined pitch consists of one of the following: one half, one third, one quarter, one eighth, or one sixteenth of the number of logic elements in the LAB.

7. The apparatus of claim 1, wherein the LAB lines are configured to both:
    (i) programmably inter-connect logic elements in the same LAB; and/or
    (ii) programmably inter-connect logic elements in different LABs.

8. The apparatus of claim 1, wherein each of the LABs in the array have a boundary, the LAB boundary being defined by the predetermined number of logic elements receiving the one or more control signals that are distributed in the LAB respectively.

9. The apparatus of claim 8, wherein the LAB lines that can connect logic elements in different LABs extend beyond the boundary of the LAB to different LABs in the array respectively.

10. The apparatus of claim 8, further comprising overlapping LABs wherein the boundary between adjacent LABs overlap and the control signals from the overlapping LABs are distributed to overlapping logic elements in the overlapping LABs respectively.

11. The apparatus of claim 1, wherein the one or more control signals consist of one or more of the following LAB control signals: clock signals, clock enable signals, clear signals, or load signals.

12. The apparatus of claim 1, wherein each LAB further comprises a programmable interconnect pattern of programmable elements that programmably connect the logic elements of the LAB to both
    (i) the LAB lines of the LAB; and
    (ii) the LAB lines of the different LAB.

13. The apparatus of claim 12, wherein the programmable elements consist of one or more of the following: multiplexers, RAM storage cells, ROM storage cell, or programmable fuses.

14. The apparatus of claim 1, wherein the inter-LAB lines consist of one or more of the following: horizontal inter-LAB lines; vertical inter-LAB lines; or L-shaped inter-LAB lines that travel in both the horizontal and vertical directions.

15. The apparatus of claim 1, further comprising a plurality of multiplexers to route signals from the plurality of inter-LAB lines to the LAB lines for each LAB in the array and vice-versa respectively.

16. An apparatus, comprising:
   a programmable logic device, the programmable logic device including:
      a plurality of LABs arranged in an array;
      a plurality of inter-LAB lines interconnecting the LABs of the array,
   wherein a first LAB in the array further includes:
      a first predetermined number of logic elements;
      first LAB lines that interconnect the first predetermined number of logic elements; and
      a first control signal generated by a first control signal generator, the first control signal being distributed to:
         (i) the first predetermined number of logic elements in the first LAB; and
         (ii) at least one logic element in a second LAB, the second LAB adjacent the first LAB in the array.

17. The apparatus of claim 16, wherein the second LAB further comprises:
   a second predetermined number of logic elements;
   second LAB lines to interconnect the second predetermined number of logic elements; and
   a second control signal generated by a second control signals generator, the second signal being distributed to:
      (i) the second predetermined number of logic elements in the second LAB; and
      (ii) one of the first predetermined number of logic elements in the first LAB.

18. The apparatus of claim 16, wherein one or more of the first LAB lines of the first LAB spans to the second LAB.

19. The apparatus of claim 16, wherein the first LAB lines of the first LAB are staggered.

20. The apparatus of claim 19, wherein the LAB lines of the first LAB are staggered by a predetermined pitch; the predetermined pitch including one of the following:
   (i) one, two, three, four, five, six, seven, eight or more logic elements; or
   (ii) half, quarter, or a third of the first predetermined number of the logic elements of the first LAB.

21. The apparatus of claim 17, wherein one or more of the second LAB lines of the second LAB span to the first LAB.

22. The apparatus of claim 17, wherein the second LAB lines are staggered.

23. An method, comprising:
   providing a programmable logic device, the provided programmable logic device including:
      a plurality of LABs arranged in an array; a plurality of inter-LAB lines interconnecting the LABs of the array,
   wherein each of the provided LABs further include:
      a predetermined number of logic elements; one or more control signals distributed among the predetermined number of logic elements in the LAB; and
      LAB lines that can inter-connect logic elements, wherein the logic elements are in different LABs in the array.

24. The method of claim 23, wherein the provided LAB lines within each LAB are provided in a staggered pattern.

25. The method of claim 24, wherein the provided staggered LAB lines within each LAB have a predetermined pitch with respect to one another.

26. A method comprising:
   providing a programmable logic device, the provided programmable logic device including:
      a plurality of LABs arranged in an array;
      a plurality of inter-LAB lines interconnecting the LABs of the array,
   wherein a first LAB in the array further includes:
      a first predetermined number of logic elements;
      first LAB lines that interconnect the predetermined number of logic elements; and
      a first control signal generated by a first control signal generator, the first control signal being distributed to:
         (i) the first predetermined number of logic elements in the first LAB; and
         (ii) a logic element in a second LAB, the second LAB adjacent the first LAB in the array.

27. The method of claim 26, wherein the provided second LAB further comprises:
   a second predetermined number of logic elements;
   second LAB lines to interconnect the second predetermined number of logic elements; and
   a second control signal generated by a second control signal generator, the second signal being distributed to:
      (i) the second predetermined number of logic elements in the second LAB; and
      (ii) one of the first predetermined number of logic elements in the first LAB.

28. The apparatus of claim 1, wherein a first subset of the LAB lines are arranged in a staggered pattern with respect to one another and a second subset of the LAB lines are arranged in a non-staggered pattern with respect to one another.

29. The apparatus of claim 1, wherein the different LABs are adjacent to one another in the array of LABs.

30. The apparatus of claim 1, wherein the different LABs are not adjacent to one another in the array of LABs.

* * * * *